United States Patent
Tsai et al.

(10) Patent No.: US 7,811,866 B2
(45) Date of Patent: Oct. 12, 2010

(54) SINGLE PASSIVATION LAYER SCHEME FOR FORMING A FUSE

(75) Inventors: Hao-Yi Tsai, Hsin-Chu (TW);
Shang-Yun Hou, Jubei (TW);
Anbiarshy N. F. Wu, Chiayi (TW);
Chia-Lun Tsai, Hsinchu (TW);
Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 416 days.

(21) Appl. No.: 11/390,951

(22) Filed: Mar. 27, 2006

(65) Prior Publication Data

US 2007/0224794 A1    Sep. 27, 2007

(51) Int. Cl.
*H01L 21/82* (2006.01)
(52) U.S. Cl. ...................................................... 438/132
(58) Field of Classification Search ................ 438/72, 438/73, 132
See application file for complete search history.

(56) References Cited

U.S. PATENT DOCUMENTS

| 6,294,474 | B1 * | 9/2001 | Tzeng et al. | 438/710 |
| 2003/0153173 | A1 * | 8/2003 | Chuang | 438/613 |
| 2005/0142834 | A1 * | 6/2005 | Lee | 438/601 |

FOREIGN PATENT DOCUMENTS

TW           583728 B      4/2004

\* cited by examiner

*Primary Examiner*—N. Drew Richards
*Assistant Examiner*—Grant S Withers
(74) *Attorney, Agent, or Firm*—Slater & Matsil, L.L.P.

(57) ABSTRACT

An integrated circuit structure comprising a fuse and a method for forming the same are provided. The integrated circuit structure includes a substrate, an interconnection structure over the substrate, a fuse connected to the interconnection structure, and an anti-reflective coating (ARC) on the fuse. The ARC has an increased thickness and acts as a remaining oxide, and no further remaining passivation layer exists on the ARC.

16 Claims, 6 Drawing Sheets

Laser Fuse Region | Bond Pad Region

SINGLE PASSIVATION LAYER SCHEME FOR FORMING A FUSE

TECHNICAL FIELD

This invention relates generally to integrated circuits, and more particularly to the structure and manufacturing methods of laser fuses.

BACKGROUND

A typical integrated circuit may include millions of devices or sub circuits, including numerous identical sub circuits. For example, a memory chip may contain millions of identical memory cells. Even if only one memory cell has defects, the entire chip may be rendered defective.

To increase yield, redundant memory cells are manufactured on the same chip. If some of the primary memory cells have defects, redundant memory cells can be used to replace the defective primary memory cells. This redundant configuration permits the semiconductor memory device to continue to operate in a normal state. The primary memory cells and redundant memory cells are all connected via fuses controlled by control circuits on the chip. As stated above, if a defective memory cell is discovered, a fuse coupled to the defective memory cell is blown and the redundant memory cell is connected instead. Accordingly, the semiconductor chip with defective primary memory cells can operate normally. This methodology is also used on other integrated circuits, particularly circuits having multiple identical units.

Highly integrated semiconductor memory devices have a fairly high manufacturing cost, which causes significant loss if any defective cells are discovered. This is why the memory devices include redundant memory cells for replacing defective primary memory cells. Types of fuses deployed in such semiconductor memory devices include electrical fuses selectively cut by the flow of excessive current, and laser fuses selectively blown by an applied laser beam. In contemporary systems, laser fuses are widely used due to their simplicity in use and layout. Electrical fuses are commonly used in semiconductor memory devices such as electrically erasable programmable read only memory (EEPROM) while laser fuses are often used in dynamic random access memory (DRAM).

Figure 1:
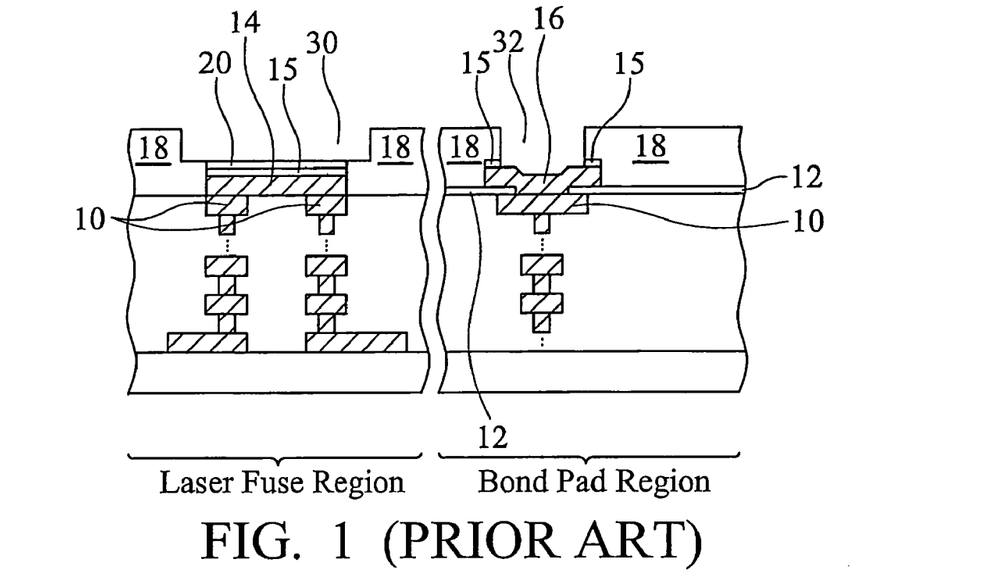
FIG. 1 illustrates a conventional laser fuse structure and a bond pad.

Fuses are conventionally fabricated simultaneously with bond pads, which are used for bonding semiconductor chips in the packaging process. FIG. 1 illustrates a conventional laser fuse structure 14 formed in a laser fuse region and a bond pad 16 formed in a pad region. In a typical formation process, after a top metallization layer 10 is formed, a first passivation layer 12 is formed. Openings are formed in the bond pad regions through the passivation layer 12 to expose the underlying top metallization layer 10. In the laser fuse region, the passivation layer 12 is removed. An AlCu layer is then formed and patterned, forming a metal fuse link 14 and a bond pad 16. During the patterning of the AlCu layer, a thin anti-reflective coating (ARC) 15, which typically has a thickness of about 300 Å, is formed to reduce the reflection from the AlCu layer. The ARC 15 remains after the AlCu layer is patterned.

A second passivation layer 18 is formed covering the fuse link 14 and bond pad 16. In the bond pad region, a window 32 is opened in the second passivation layer 18 and the ARC 15, so that the bond pad 16 is exposed. In the fuse region, a window 30 is formed. Different from the bond pad region, a thin passivation layer 20, often referred to as remaining oxide, is left over the metal fuse link 14. The thin passivation layer 20 serves two purposes. It insulates the fuse link 14 from the external environment and protects the fuse link 14 from corrosion. In addition, if a laser repair is performed, the thin passivation layer 20 insulates the heat absorbed by metal fuse link 14 from escaping to achieve an effective burnout.

The conventional laser fuse formation processes suffer drawbacks, however. Since it is hard to accurately control the thickness of the remaining passivation layer 20 during the etching of the passivation layer 18, the subsequent laser burning process is adversely affected, and the laser repair yield is lowered. Additionally, two passivation layers 12 and 18 have to be formed, resulting in increased process complexity and cost. Accordingly, there is the need to improve the formation processes of laser fuses.

SUMMARY OF THE INVENTION

In accordance with one aspect of the present invention, a method for forming an integrated circuit structure includes providing a substrate, forming an interconnection structure over the substrate, forming a metal layer over and electrically connected to a top metallization layer of the interconnection structure, forming an anti-reflective coating (ARC) on the metal layer, patterning the ARC and the metal layer to form a fuse, blanket forming a dielectric layer, and substantially removing the dielectric layer from at least a portion of the ARC to expose the ARC.

In accordance with another aspect of the present invention, a method for forming an integrated circuit structure includes providing a substrate comprising a laser fuse region and a pad region, forming a first and a second interconnection structure over the substrate, forming a metal layer over a top metallization layer of the first and the second interconnection structures, forming an anti-reflective coating (ARC) on the metal layer, and patterning the ARC and the metal layer to form a laser fuse in the laser fuse region and connected to the first interconnection structure and a bond pad in the pad region and connected to the second interconnection structure. The method further includes blanket forming a polyimide, removing a portion of the polyimide and the ARC from over a portion of the bond pad to expose the bond pad, and substantially removing the polyimide from at least a portion of a region overlying the laser fuse. No passivation layer is formed over the ARC.

In accordance with yet another aspect of the present invention, a semiconductor structure includes a substrate, an interconnection structure over the substrate, a fuse connected to the interconnection structure, and an anti-reflective coating (ARC) on the fuse. The ARC has an increased thickness and acts as a remaining passivation layer, and no further remaining passivation layer is formed on the ARC.

In accordance with yet another aspect of the present invention, an integrated circuit structure includes a substrate comprising a fuse region and a pad region, a first and a second interconnection structure over the substrate, a fuse connected to the first interconnection structure and in the fuse region, and a bond pad connected to the second interconnection structure and in the pad region. The bond pad and the fuse are formed in a same metal layer. The integrated circuit structure further includes an anti-reflective coating (ARC) on the fuse and a polyimide on the ARC over a portion of the bond pad. The bond pad is exposed through an opening in the polyimide and the ARC. At least one portion of a region over the fuse is substantially free from the polyimide.

The advantageous features of the present invention include using the ARC as a remaining passivation layer, so that process steps and costs for forming and thinning a passivation layer over the laser fuse are saved. A further advantageous feature of the present invention is that the thickness of the ARC layer is easier to control than thinning the passivation layer over the laser fuse, and thus the laser repair yield is improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 11B are cross-sectional views of intermediate stages in the manufacture of a preferred embodiment of the present invention, wherein an integrated circuit structure including a laser fuse and a bond pad is formed.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which includes the formation of a laser fuse and a bond pad, are illustrated. Throughout the various views and illustrative embodiments of the present invention, like reference numbers are used to designate like elements.

Figure 2:
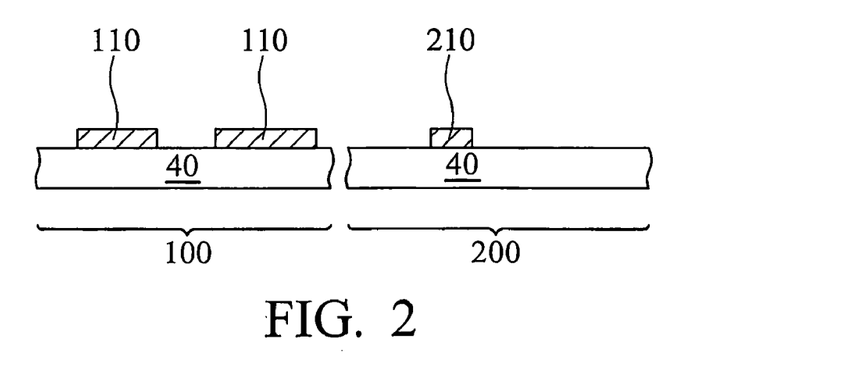

FIG. 2 illustrates a substrate 40 on which integrated circuits (not shown) are formed. Substrate 40 and the subsequently formed overlying structures include two regions, a region 100 for forming a laser fuse and a region 200 for forming a bond pad. In laser fuse region 100, conductive lines 110 are formed over the substrate 40 and are electrically coupled to integrated circuit devices (not shown), such as redundant memory cells or other redundant circuits. In pad region 200, a feature 210, which symbolizes a device or an electrical connection to a device, is shown.

Figure 3:
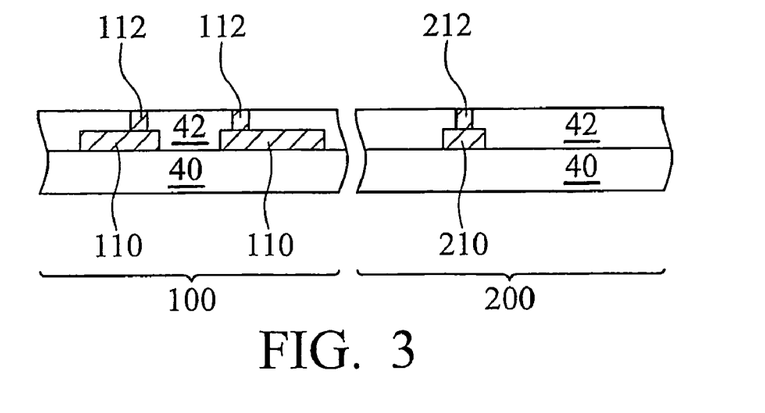

Referring to FIG. 3, an inter-layer dielectric (ILD) 42 is formed in both regions 100 and 200. Contact plugs 112 are formed through ILD 42 to connect to the conductive lines 110. A contact plug 212 is formed to connect to the feature 210. As is known in the art, contact plugs 112 and 212 are preferably formed by etching contact openings in ILD 42 and filling the openings with conductive materials, which preferably comprise tungsten, aluminum, copper, or other well-known alternatives. Contact plugs 112 and 212 may also have composite structures, including, e.g., barrier and adhesion layers comprising materials such as tantalum, titanium, titanium nitride, tantalum nitride, and the like.

Figure 4:
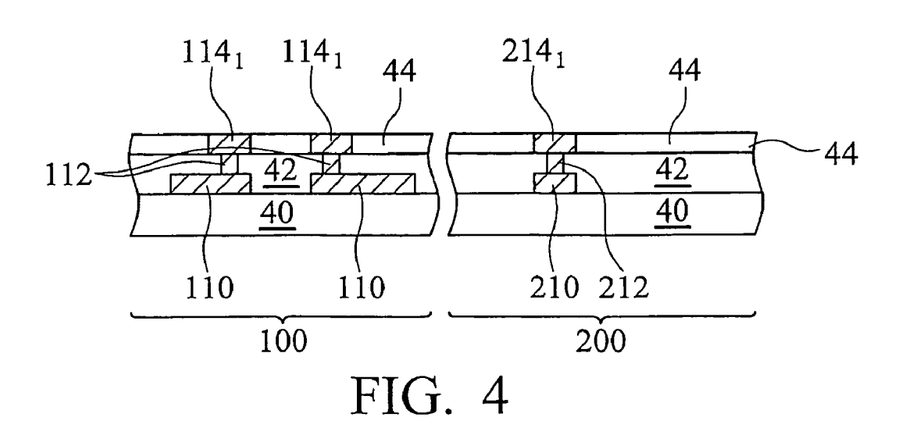

FIG. 4 illustrates the formation of metal lines $114_1$ and $214_1$ in a metallization layer one, which is often referred to as $M_1$. Throughout the description, subscripts are used to indicate respective metallization layers. The metal lines $114_1$ and $214_1$ are preferably formed using a single damascene process.

As is known in the art, to form metal features in $M_1$, a low-k dielectric layer 44 is formed over ILD 42. The dielectric layer 44 preferably comprises a low-k dielectric material with a k value lower than about 3.0, and more preferably lower than about 2.5. An etch stop layer (not shown) may optionally be formed between the low-k dielectric layer 44 and the ILD 42.

Trenches are then formed in low-k dielectric layer 44. A diffusion barrier layer (not shown) is preferably formed in the trenches. Metal or metal alloys, such as copper or copper alloys, are then filled into the trenches, followed by a chemical mechanical polish (CMP) to remove excess material. The remaining conductive materials form metal lines $114_1$ and $214_1$, which are connected to contact plugs 112 and 212, respectively.

Figure 5:
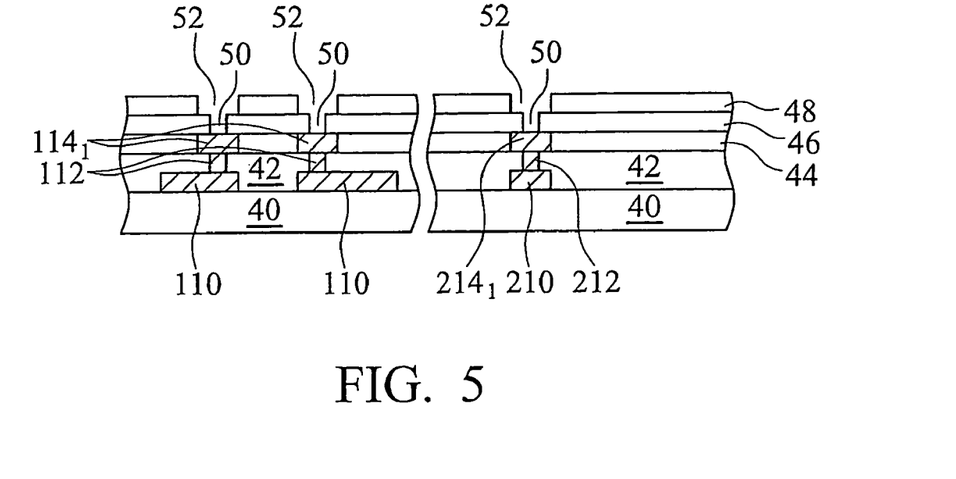

Dual damascene processes are preferably performed to form the metallization layer two ($M_2$) and the underlying vias. FIG. 5 shows the formation of a via inter-metal dielectric (IMD) layer 46 over the dielectric layer 44, followed by the formation of a trench IMD layer 48 over the via IMD layer 46. Trench IMD layer 48 and via IMD layer 46 preferably have low k values of less than about 2.5. The materials and methods of forming via IMD layer 46 and trench IMD layer 48 are known in the art, and thus details are not repeated herein. In the preferred embodiment, dielectric layers 44, 46 and 48 have different etching characteristics, thus an underlying layer may be used as an etch stop layer when an overlying layer is etched. In alternative embodiments, etch stop layers may be formed between neighboring layers. In yet other embodiments, a single layer functioning as both the layers 46 and 48 is formed.

Via openings 50 and trench openings 52 are then formed, preferably by etching via IMD layer 46 and trench IMD layer 48. In the preferred embodiment, via IMD layer 46 is used as an etch stop layer for etching trench openings 52. In alternative embodiments wherein the via IMD layer 46 and trench IMD layer 48 are combined as a single layer, the depth of the trench openings 52 is controlled by adjusting the etching time.

Figure 6:
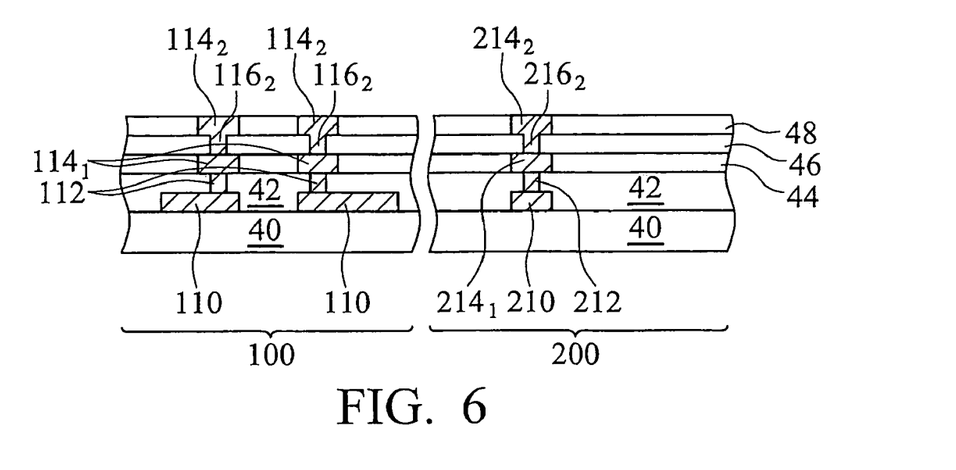

FIG. 6 illustrates the formation of metal lines $114_2$ and $214_2$ and vias $116_2$ and $216_2$. A barrier layer (not shown), preferably comprising titanium, titanium nitride, tantalum, tantalum nitride, or combinations thereof, is formed in openings 50 and 52. The barrier layer prevents copper from diffusing into neighboring IMD layers 46 and 48. The remaining space of the via openings 50 and trench openings 52 is filled with conductive materials, preferably copper or copper alloys. A CMP is performed to level the surface, leaving metal lines $114_2$ and $214_2$ and vias $116_2$ and $216_2$.

Figure 7:
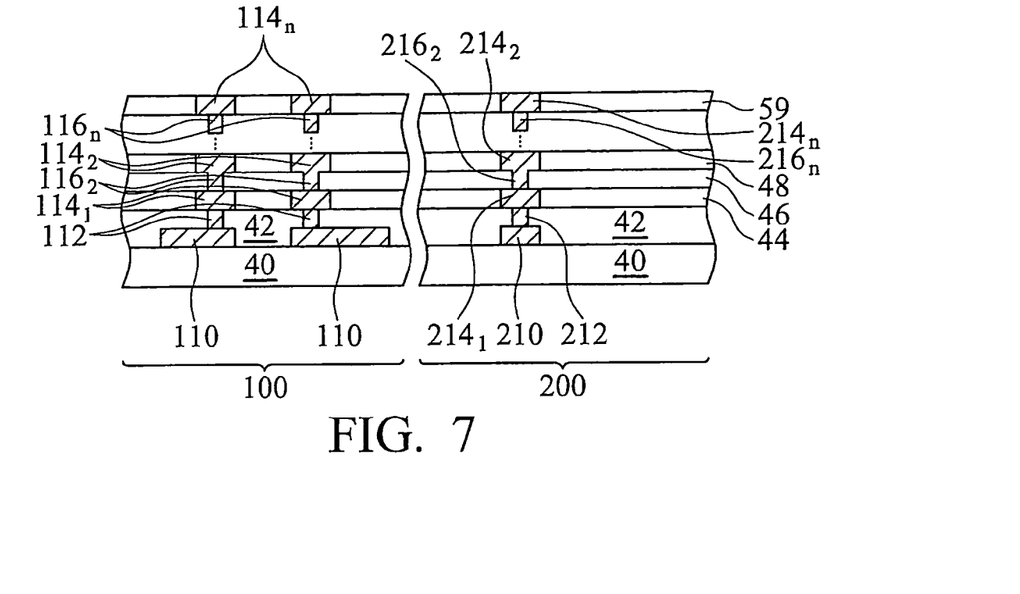

Metal lines $114_3$ (not shown) through $114_n$ and $214_3$ through $214_n$, and vias $116_3$ (not shown) through $116_n$ and $216_3$ through $216_n$, are then formed layer by layer, each connecting to a respective underlying metal feature. A resulting structure is shown in FIG. 7. For purposes of illustration, the metal features are shown vertically aligned and overlying features 110 and 210. In many embodiments, the various metal lines and vias will be laterally displaced from one another, depending upon the design and layout of the actual integrated circuit.

In the preferred embodiment, the top metallization layer $M_n$ is preferably formed in a top dielectric layer 59 that is suitable for preventing moisture penetration and is mechanically stronger than low-k IMDs. Preferred materials include un-doped silicate glass, fluorine-doped silicon oxide, and the like. However, low-k dielectric materials can also be used.

Although in the previously shown embodiment, dual damascene processes are used for forming metallization layers $M_2$ though the top metallization layer $M_n$ and the respective underlying vias, one skilled in the art will realize that single damascene processes, or the combination of dual damascene processes and single damascene processes, can also be used.

Figure 8:
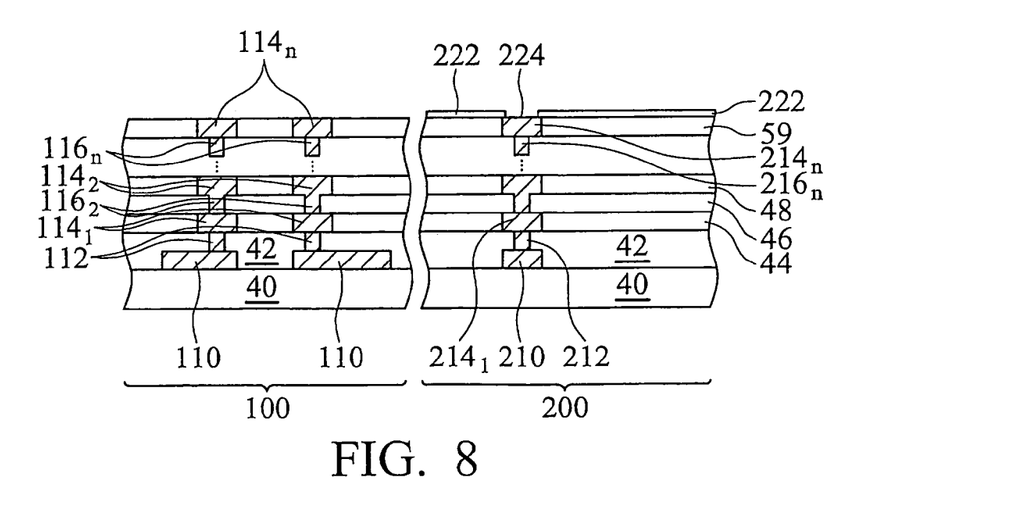

Referring to FIG. 8, a passivation layer 222 is formed. In the preferred embodiment, the passivation layer 222 is formed using plasma enhanced chemical vapor deposition (PECVD) or other commonly used methods such as atmospheric pressure chemical vapor deposition (APCVD), high density plasma chemical vapor deposition (HDPCVD), atomic layer deposition (ALD), and the like. Passivation layer 222 preferably comprises materials such as silicon oxide, silicon oxynitride (SiON), polyimide, silicon nitride (SiN), silicon oxycarbide (SiOC), and the like. In laser fuse region 100, passivation layer 222 is preferably removed. In pad region 200, an opening 224 is formed through the passivation layer 222 to expose the underlying metal line $214_n$.

Figure 9:
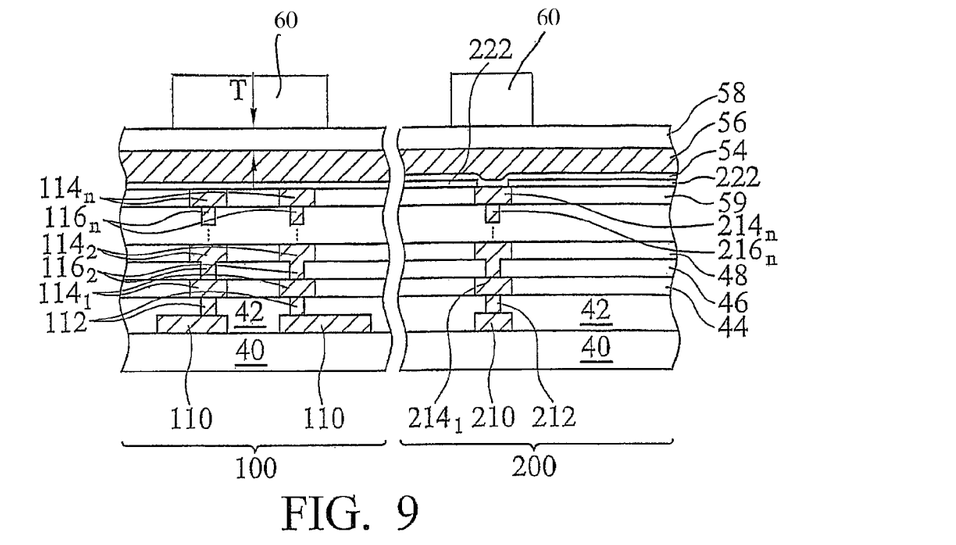

FIG. 9 illustrates the formation of a barrier layer 54, a metal layer 56, an anti-reflective coating (ARC) 58, and a photo resist 60. The barrier layer 54 is used to prevent copper in the top metallization layer $M_n$ from diffusing to the underlying dielectric materials, and preferably comprises metals having low diffusion ability, such as tantalum, tantalum nitride, titanium, titanium nitride, and the like. In the preferred embodiment, the metal layer 56 comprises AlCu, and may be formed using sputtering, physical vapor deposition (PVD), thermal evaporation, and the like. In alternative embodiments, the metal layer 56 comprises aluminum, copper, gold, tungsten, or other commonly used metals and metal alloys. Please note that the features shown are not drawn to scale, and layer 54 may only fill a bottom portion of the opening 224.

The ARC 58, which preferably comprises SiON, SiOC, SiON/SiO composite layer, and the like, is formed on the metal layer 56. The preferred thickness T of the ARC 58 is greater than about 300 Å, and more preferably greater than about 2000 Å. The photo resist 60 is then formed on the ARC 58 and is patterned.

Figure 10:
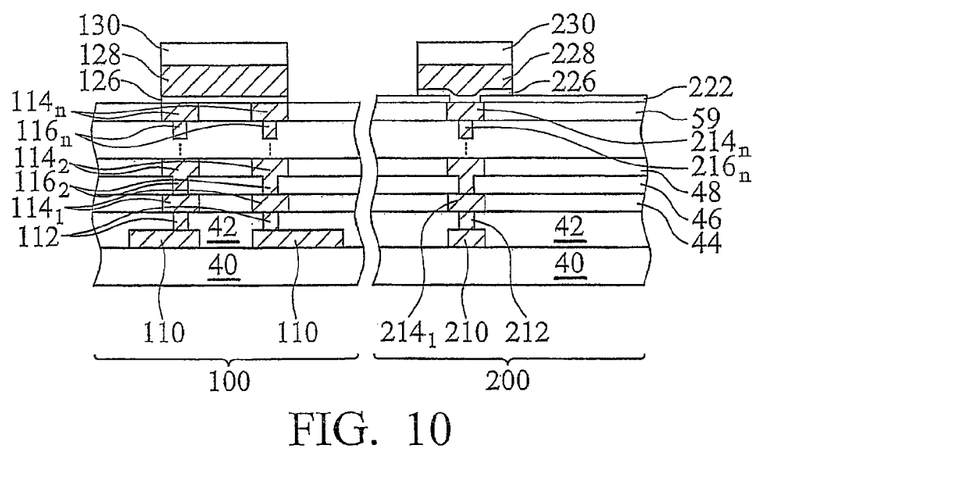

The stacked layers 54, 56 and 58 are then etched, and a resulting structure is shown in FIG. 10. In the laser fuse region 100, a remaining portion of the metal layer 56 forms a fuse line 128, while in pad region 200, a remaining portion of the metal layer 56 forms a bond pad 228. The remaining portions of the barrier layer 54 form barriers 126 and 226, respectively. The remaining portions of the ARC 58 form ARCs 130 and 230 in laser fuse region 100 and pad region 200, respectively.

Figure 11A:
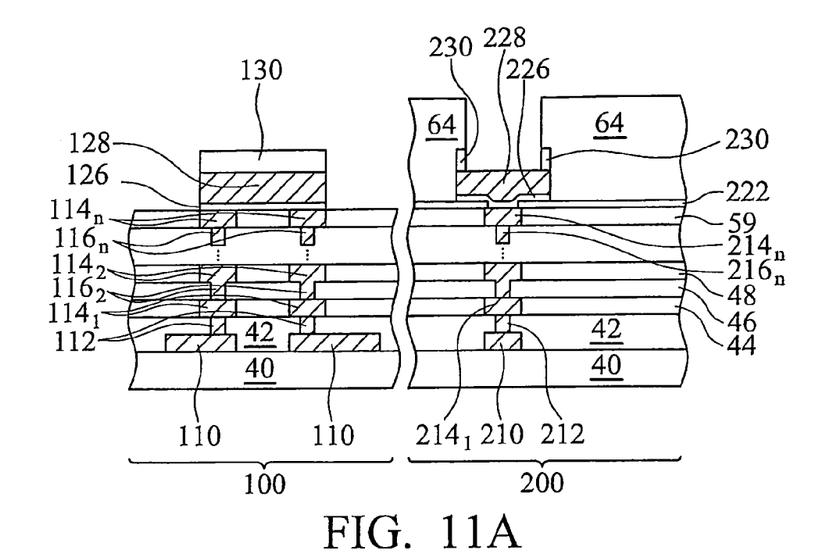
Figure 11B:
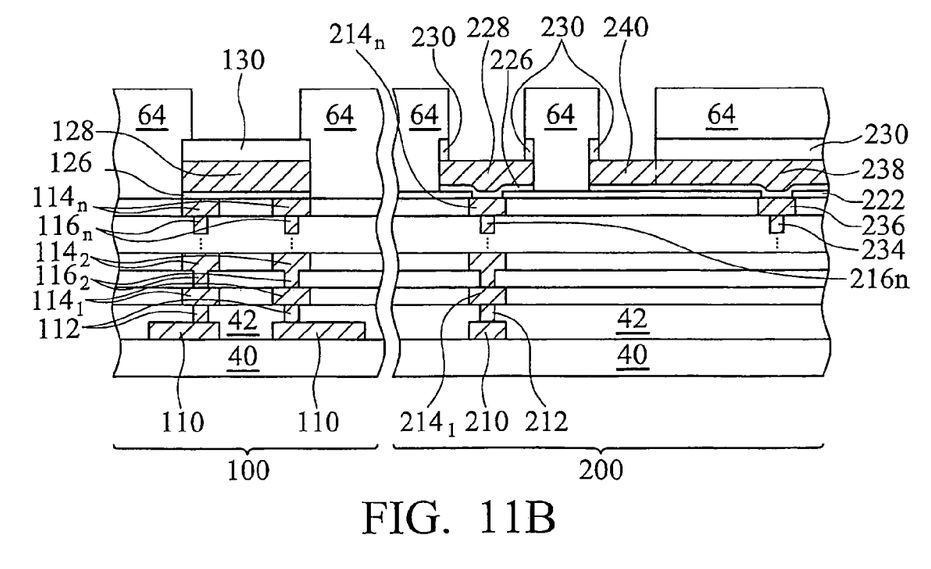

FIG. 11A illustrates the formation of a protection layer 64. In the preferred embodiment, the protection layer 64 is formed of polyimide. Preferably, the polyimide 64 has a thickness of between about 3 µm and about 10 µm. Polyimide 64 is developed and cured, exposing the overlying ARC 230. The exposed ARC 230 is then etched, and the bond pad 228 is exposed. Note that polyimide is a photo resist, thus the cost for forming polyimide 64 is significantly lower than the cost for forming a conventional passivation layer whose formation needs additional passivation layer formation and lithography steps. In the preferred embodiment, the polyimide 64 is removed from laser fuse region 100. In other embodiments, as shown in FIG. 11B, polyimide 64 is left in region 100. In this case, an opening is formed through polyimide 64 to expose the ARC 130.

It is to be noted that besides forming the fuse link 128 and bond pad 228, the metal layer 56 can also be patterned to form redistribution lines. FIG. 11B illustrates a redistribution scheme. A redistribution line 238 is connected to a top metal line 236 and the underlying via 234 at one end, and a bond pad 240 at the other end. The bond pad 240 and the redistribution line 238 are actually formed simultaneously. With such a scheme, the pad metal layer 56 also helps to route interconnections in addition to the function of forming laser fuses and bond pads.

The preferred embodiments of the present invention have several advantageous features. By increasing the thickness of the ARC 130, ARC 130 acts as a remaining oxide (passivation layer), and it is not necessary to form a second passivation layer. As a result, the cost (processes and masks) for forming and thinning a second passivation layer to form the remaining oxide is saved. Since the thickness of the ARC 130 is easier to control than the thickness of the remaining passivation (oxide) layer, whose formation involves a thinning process, the laser repair yield is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
   providing a substrate;
   forming an interconnection structure over the substrate;
   forming a metal layer over and electrically connected to a top metallization layer of the interconnection structure;
   forming an anti-reflective coating (ARC) on the metal layer;
   patterning the ARC and the metal layer, wherein portions of the metal layer form a fusible fuse link and a bond pad by the step of patterning the ARC and the metal layer, and wherein remaining portions of the ARC comprise a first portion directly over the fusible fuse link and a second portion directly over the bond pad;
   blanket forming a dielectric layer;
   removing portions of the dielectric layer to expose the first portion and the second portion of the ARC; and
   performing a removal step to remove the second portion of the ARC to expose a top surface of the bond pad, wherein the first portion of the ARC is not removed by the removal step, and remains over the fusible fuse link.

2. The method of claim 1, wherein the dielectric layer comprises polyimide.

3. The method of claim 1, wherein the dielectric layer is removed from a region adjacent to and not over the fusible fuse link.

4. The method of claim 1, wherein the ARC has a thickness of greater than about 300 Å.

5. The method of claim 4, wherein the ARC has a thickness of greater than about 2000 Å.

6. The method of claim 1, wherein the ARC is a dielectric layer.

7. A method for forming an integrated circuit structure, the method comprising:
   providing a substrate comprising a fuse region and a pad region;
   forming a first and a second interconnection structure over the substrate;
   forming a metal layer over a top metallization layer of the first and the second interconnection structures;

forming an anti-reflective coating (ARC) on the metal layer;

patterning the ARC and the metal layer, wherein portions of the metal layer form a fusible fuse link and a bond pad by the step of patterning the ARC and the metal layer, wherein the fusible fuse link is in the fuse region and electrically coupled to the first interconnection structure, wherein the bond pad is in the pad region and electrically coupled to the second interconnection structure, and wherein remaining portions of the ARC comprise a first portion directly over the fusible fuse link and a second portion directly over the bond pad;

blanket forming a dielectric layer;

removing portions of the dielectric layer to expose the first portion and the second portion of the ARC; and performing a removal step to remove the second portion of the ARC to expose the bond pad, wherein the first portion of the ARC is not removed by the removal step and remains over the fusible fuse link.

8. The method of claim 7, wherein the ARC has a thickness of greater than about 300 Å.

9. The method of claim 8, wherein the ARC has a thickness of greater than about 2000 Å.

10. The method of claim 7, wherein the ARC comprises a material selected from the group consisting essentially of SiON, SiOC, SiON/SiO composite layer, and combinations thereof.

11. The method of claim 7, wherein a top surface of the fusible fuse link is level with a top surface of the bond pad.

12. The method of claim 7, wherein after the step of removing portions of the dielectric layer, sidewalls of the fusible fuse link are exposed.

13. The method of claim 7, wherein after the step of removing portions of the dielectric layer, sidewalls of the fusible fuse link are covered by the dielectric layer.

14. The method of claim 1, wherein after the step of removing portions of the dielectric layer, sidewalls of the fusible fuse link are exposed.

15. The method of claim 1, wherein after the step of removing portions of the dielectric layer, sidewalls of the fusible fuse link are covered by the dielectric layer.

16. The method of claim 1, wherein a top surface of the fusible fuse link is level with a top surface of the bond pad.

\* \* \* \* \*